(12) United States Patent
Hirano et al.

(10) Patent No.: US 8,441,614 B2
(45) Date of Patent: May 14, 2013

(54) PROCESSING APPARATUS AND DEVICE MANUFACTURING METHOD

(75) Inventors: Shinichi Hirano, Utsunomiya (JP); Mitsuji Marumo, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 930 days.

(21) Appl. No.: 12/512,939

(22) Filed: Jul. 30, 2009

(65) Prior Publication Data

US 2010/0026980 A1    Feb. 4, 2010

(30) Foreign Application Priority Data

Jul. 31, 2008    (JP) ................................. 2008-197125

(51) Int. Cl.
*G03B 27/58* (2006.01)

(52) U.S. Cl.
USPC .............................................. 355/72; 355/75

(58) Field of Classification Search .................... 355/72, 355/75; 414/222.01; 700/114
See application file for complete search history.

(56) References Cited

U.S. PATENT DOCUMENTS

| | | | | |
|---|---|---|---|---|
| 2005/0280798 A1* | 12/2005 | Kuit et al. | ........................ | 355/72 |
| 2007/0159615 A1* | 7/2007 | Horiuchi | ......................... | 355/72 |
| 2009/0033906 A1* | 2/2009 | Kumazaki | ....................... | 355/72 |
| 2011/0076117 A1* | 3/2011 | Iizuka | ........................... | 414/217 |

FOREIGN PATENT DOCUMENTS

| | | | |
|---|---|---|---|
| EP | 1939930 A1 * | 7/2008 | |
| JP | 2006-024682 | 1/2006 | |
| JP | 2008-066341 A | 3/2008 | |
| WO | 2007/116752 A1 | 10/2007 | |
| WO | WO 2007116752 A1 * | 10/2007 | |

* cited by examiner

*Primary Examiner* — Hoon Song
*Assistant Examiner* — Mona M Sanei
(74) *Attorney, Agent, or Firm* — Canon USA Inc IP Division

(57) ABSTRACT

A processing apparatus of the present invention processes for a wafer 9. The processing apparatus includes an XY stage 6 which includes a wafer chuck 8 which holds the wafer 9 and an elevating device which rises relative to the wafer chuck 8 to hold the wafer 9, and a wafer conveying robot hand 14 which conveys the wafer 9 from the XY stage 6 at a wafer transfer position 18. The XY stage 6 moves to change a direction at an angle between 30 degree and 120 degree via the wafer transfer position 18 in a state where the elevating device rises relative to the wafer chuck 8. The wafer conveying robot hand 14 has a shape which does not interfere with the XY stage 6 which moves to change the direction at the angle when the wafer conveying hand 14 is positioned at the wafer transfer position 18.

10 Claims, 8 Drawing Sheets

PROCESSING APPARATUS AND DEVICE MANUFACTURING METHOD

BACKGROUND OF THE INVENTION

1. Field of the Invention

The present invention relates to a processing apparatus and a device manufacturing method.

2. Description of the Related Art

The performance of an exposure apparatus used for a device manufacturing process such as a semiconductor or a liquid crystal panel is especially evaluated from viewpoints of resolution, overlay accuracy, and throughput. The resolution means an index of a miniaturization, the overlay accuracy means an alignment performance for each layer of a device, and the throughput means device production capacity per unit time.

In order to improve the productivity of the device, a various kind of methods for improving throughput of an exposure apparatus has been conventionally considered. For example, a method for increasing the exposure energy per unit time, shortening the moving step time between shots of the wafer stage, or the like has been considered. A method for shortening the wafer conveying and exchanging time at the time of exchanging wafers, shortening the scanning time in a scanning exposure apparatus, or the like has also been considered.

When improving throughput, in order to shorten the conveying time at the time of exchanging wafers, shortening the conveying distance of the wafer is effective. However, in the exposure apparatus, in order to realize high resolution and high overlay accuracy, the layout inside the apparatus has to give more priority to the arrangement of the a projection lens, an illumination system unit that is a light source, an exposure wafer movable stage, and a wafer position measurement unit. For such a reason, it is difficult to shorten the conveying time by shortening the conveying distance of the wafer.

As another method for shortening the conveying time, improving an ability of a drive motor of the conveying robot has been considered. However, if the ability of the drive motor attempts to be improved, the occupied volume of the motor grows larger. Therefore, there are problems that each member can not be arranged in a limited space inside the apparatus, heat value increases due to the increased drive energy, and the risk of dropping the wafer increases due to the increase of the conveying velocity and the acceleration.

With regard to two robot hands used for conveying a wafer, for example, Japanese Patent Laid-Open No. 2006-24682 discloses a delivering method for delivering a wafer. Japanese Patent Laid-Open No. 2006-24682 proposes a bilaterally asymmetric robot hand. However, a balance between the improvement of throughput and the safety in delivering the wafer between one robot hand and a wafer stage movable in all directions has been a problem.

BRIEF SUMMARY OF THE INVENTION

The present invention provides a processing apparatus which improves throughput. Further, the present invention provides a device manufacturing method using the processing apparatus.

A processing apparatus as one aspect of the present invention is a processing apparatus configured to process a substrate. The processing apparatus includes a movable stage which includes a chuck configured to hold the substrate and an elevating device configured to rise relative to the chuck to hold the substrate, and a movable hand configured to convey the substrate from the movable stage at a transfer position. The movable stage moves to change a direction at an angle between 30 degree and 120 degree via the transfer position in a state where the elevating device rises relative to the chuck. The movable hand has a shape which does not interfere with the movable stage configured to move to change the direction at the angle when the movable hand is positioned at the transfer position.

A processing apparatus as another aspect of the present invention is a processing apparatus configured to process a substrate. The processing apparatus includes a movable stage which includes a chuck configured to hold the substrate and an elevating device configured to rise relative to the chuck to hold the substrate and is configured to move between a substrate process position, a substrate transfer position, and a substrate supply position, a first movable hand configured to convey the substrate held by the elevating device relatively risen from the movable stage at the substrate transfer position, and a second movable hand configured to supply the substrate to the movable stage at the substrate supply position. An angle between a first straight line which connects the substrate transfer position with the substrate process position and a second straight line which connects the substrate transfer position and the substrate supply position is between 30 degrees and 120 degrees. The first movable hand has a shape which does not overlap with a trajectory of the elevating device moving from the substrate process position to the substrate supply position via the substrate transfer position when the movable hand is positioned at the substrate transfer position.

A device manufacturing method as another aspect of the present invention is a device manufacturing method including the steps of exposing a substrate using the processing apparatus, and developing the substrate exposed in the exposing step.

Further features and aspects of the present invention will become apparent from the following description of exemplary embodiments with reference to the attached drawings.

DETAILED DESCRIPTION OF THE PREFERRED EMBODIMENTS

Figure 1:
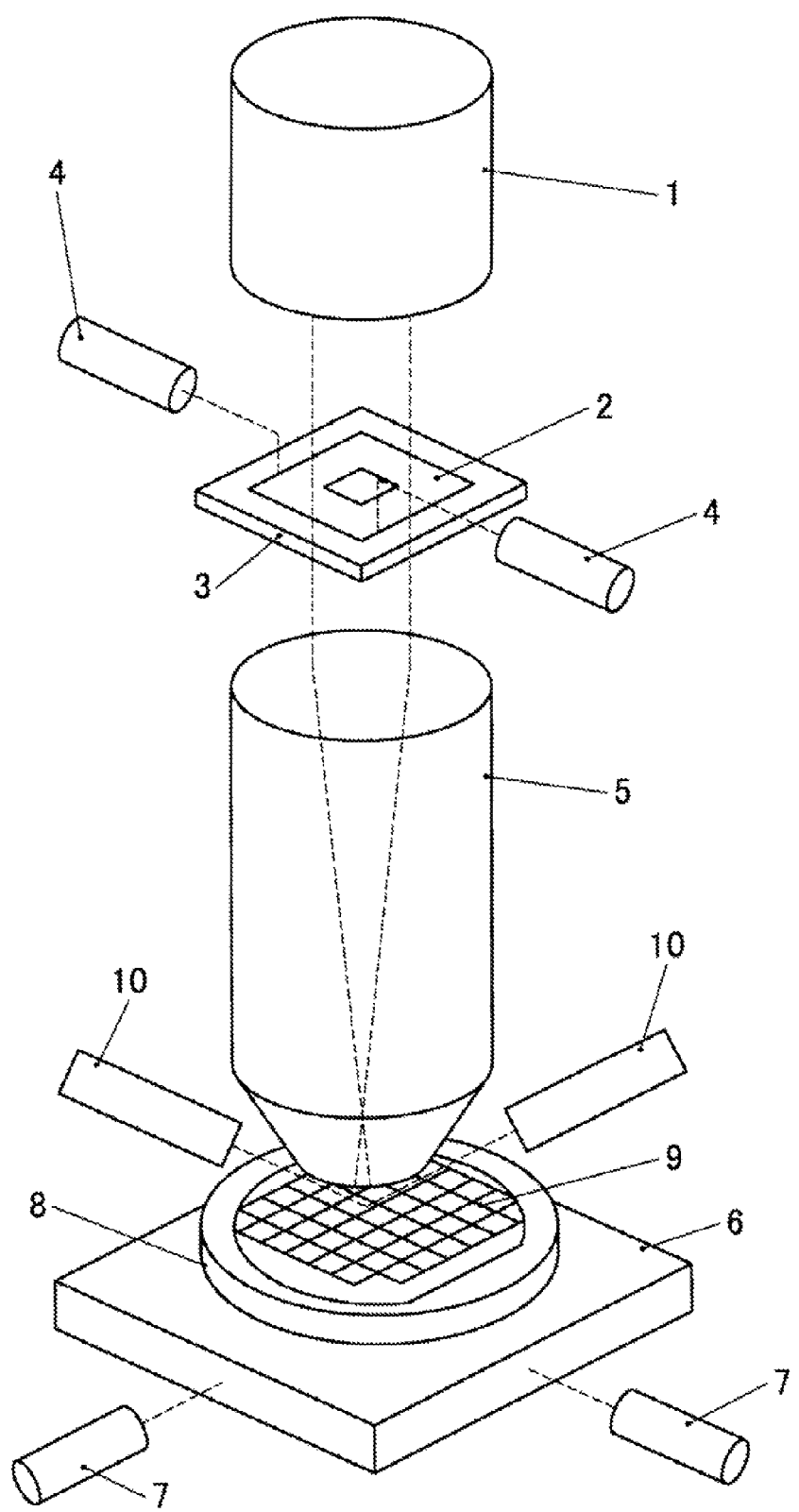
FIG. 1 is a schematic view of an exposure apparatus in the present embodiment.

Exemplary embodiments of the present invention will be described below with reference to the accompanied drawings.

In each of the drawings, the same elements will be denoted by the same reference numerals and the duplicate descriptions thereof will be omitted.

An exposure apparatus of the present embodiment is used in a process of manufacturing a semiconductor wafer or the like, and for the purpose of improving throughput, a hand shape of a wafer conveying robot and a wafer conveying control method are improved. Although the present invention will be focused on an exposure apparatus as one example of a processing apparatus, the process for the substrate is not limited to the exposure. An arbitrary processing such as other well-known measurement or fabrication can be adopted. Thus, transferring a pattern onto a substrate by exposing the substrate is one included in processes for the substrate.

First, the outline of the exposure apparatus of the present embodiment will be described. FIG. 1 is a schematic configuration view of an exposure apparatus 100 in the present embodiment.

Reference numeral 1 denotes an illumination apparatus. The illumination apparatus 1 is provided with a light source and a shutter (not shown) inside it. Reference numeral 2 denotes a reticle (original plate). A circuit pattern is depicted on the reticle 2. The circuit pattern formed on the reticle 2 is projected onto a wafer by irradiating light onto the reticle 2 using the illumination apparatus 1

Reference numeral 3 denotes a reticle stage. The reticle stage 3 is provided for mounting the reticle 2 on it. Reference numeral 4 denotes a reticle position measurement mechanism. The reticle position measurement mechanism 4 measures a position of the reticle 2 mounted on the reticle stage 3. Reference numeral 5 denotes a projection exposure lens. The projection exposure lens 5 constitutes a projection optical system for printing.

Reference numeral 6 denotes an XY stage (movable stage). The XY stage 6 mounts a wafer 9 (substrate) that is an object to be printed and moves in two directions of X and Y in a XY plane. As described later, the XY stage 6 includes a chuck which holds the wafer 9 and an elevating device which rises relative to the chuck and holds the wafer 9.

Reference numeral 7 denotes a laser interferometer to measure a position of the XY stage 6. Reference numeral 8 denotes a wafer chuck (chuck) to absorb the wafer 9 to hold it. Reference numeral 10 denotes an autofocus unit to measure a pint position of the wafer 9.

The exposure apparatus 100 of the present embodiment is provided with a wafer Z drive mechanism (not shown) which moves the wafer 9 in a perpendicular direction, for adjusting the pint (hereinafter, referred to as "focusing") at the time of exposure in a state of mounting the wafer 9. The wafer Z drive mechanism is provided at the bottom of the wafer chuck 8.

Figure 2:
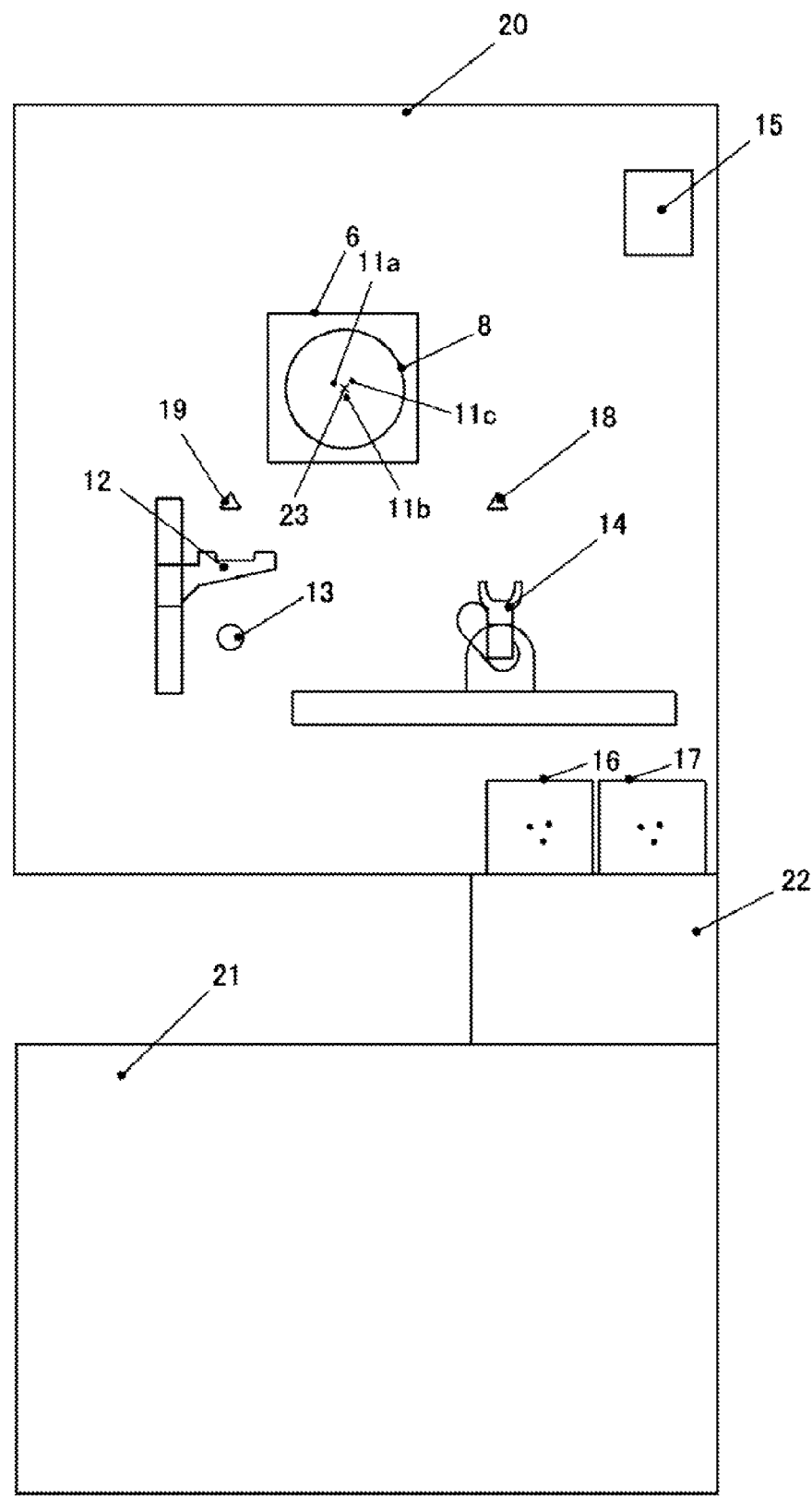
FIG. 2 is a plan view showing a wafer conveying path of an exposure apparatus in the present embodiment.

Next, a wafer conveying path in the exposure apparatus of the present embodiment will be described. FIG. 2 is a schematic view of the wafer conveying path in the exposure apparatus 100 seen from the top plane of the apparatus. The exposure apparatus 100 of the present embodiment is connected to an external apparatus to be operated in a semiconductor factory.

In FIG. 2, reference numeral 20 denotes an exposure apparatus chamber. It is necessary for the exposure apparatus 100 to maintain the exposure environment to be a constant temperature and humidity. The exposure apparatus chamber 20 is used for maintaining the inside temperature and humidity.

Inside the exposure apparatus chamber 20, the wafer chuck 8 for absorbing and holding the wafer 9 is positioned at the bottom of the projection exposure lens 5. The wafer chuck 8 is provided with three pins 11a, 11b, and 11c (elevating device) which are driven in upward and downward directions for delivering the wafer 9. The three pins 11a, 11b, and 11c rise relative to the wafer chuck 8 to hold the wafer 9.

The XY stage 6 integrally moves the wafer 9, the wafer chuck 8, and the three pins 11a, 11b, and 11c (elevating device) in two directions of X and Y directions in an XY plane. The final shot exposure position inside the exposure apparatus chamber 20 is defined as a wafer exposure position 23.

Inside the exposure apparatus chamber 20, a wafer carry-in station 16 and a wafer carry-out station 17 are arranged. The wafer carry-in station 16 carries in an unexposed wafer from the outside to the inside of the exposure apparatus chamber 20 to arrange it at a specific area. The wafer carry-out station 17 arranges an exposed wafer at a specific area for carrying the exposed wafer outside the exposure apparatus chamber 20.

Furthermore, inside the exposure apparatus chamber 20, a control computer 15 (controller) is provided. The control computer 15 controls each motion of the exposure apparatus 100.

Reference numeral 13 denotes a wafer pre-alignment unit. The wafer pre-alignment unit 13 performs an alignment of the wafer.

Reference numeral 14 denotes a wafer conveying robot hand (a first movable hand). The wafer conveying robot hand 14 conveys the wafer which has been carried from the outside to the inside of the exposure apparatus chamber 20 from the wafer carry-in station 16 to the wafer pre-alignment unit 13.

The wafer conveying robot hand 14 conveys the exposed wafer positioned on the three pins 11a, 11b, and 11c to the wafer carry-out station 17. In this case, the wafer conveying robot hand 14 conveys the exposed wafer held by these pins from the XY stage 6 by the rise of the three pins 11a, 11b, and 11c.

Reference numeral 12 denotes a wafer dispatching hand (a second movable hand). The wafer dispatching hand 12 conveys the pre-aligned wafer 9 from the wafer pre-alignment unit 13 onto the three pins 11a, 11b, and 11c. In other words, the wafer dispatching hand supplies the wafer to the XY stage 6.

In the present embodiment, as a delivery mechanism of the wafer between the wafer chuck 8 and the three pins 11a, 11b, and 11c, the delivery mechanism which is configured so that the three pins 11a, 11b, and 11c (elevation device) goes up and goes down is adopted. The present invention is not limited to this, but the wafer chuck 8 can be configured so that the wafer chuck 8 goes up and down in a state where the three pins 11a, 11b, and 11c are stopped. Also in this case, similarly to the embodiment described above, delivering the wafer is possible.

Next, a place where the wafer is delivered will be described.

The wafer dispatching hand 12 delivers (supplies) the wafer to the three pins 11a, 11b, and 11c positioned on the XY stage 6 at a wafer supply position 19 (substrate supply position). The wafer conveying robot hand 140 receives (conveys) the wafer from the three pins 11a, 11b, and 11c positioned on the XY stage 6 at a wafer transfer position 18 (substrate transfer position).

The XY stage 6 moves to change its direction via the wafer transfer position 18 in a state where the three pins 11a, 11b, and 11c rises relative to the wafer chuck 8. In the embodiment, when the XY stage 6 changes the direction via the wafer transfer position 18, an angle between directions before and after the change is preferably between 30 degrees and 120 degrees. In other words, the angle between a first straight line connecting the wafer transfer position 18 with a wafer exposure position 23 and a second straight line connecting the wafer transfer position 18 and the wafer supply position 19 is set to the range between 30 degrees and 120 degrees.

In the embodiment, to be exact, the wafer exposure position 23, the wafer transfer position 18, and the wafer supply position 19 correspond to positions of center of gravity of the wafer 9 mounted on the XY stage 6 when the XY stage 6 moves to the respective areas.

As described later, when the wafer conveying robot hand 14 is positioned at the wafer transfer position 18, it has a shape which does not interfere with the XY stage 6 changing its direction at the above angle. In other words, a holder of the wafer conveying robot hand 14 conveys the wafer without intruding inside a triangle whose corners are the wafer exposure position 23, the wafer transfer position 18, and the wafer supply position 19.

The positions shown in FIG. 2 as the wafer transfer position 18 and the wafer supply position 19 are specific positions on a movable plane of the XY stage 6. Actually, objects of the shape shown in FIG. 2 are not arranged as the wafer transfer position 18 and the wafer supply position 19.

Next, the connection between the exposure apparatus 100 (exposure apparatus chamber 20) and an external apparatus of the exposure apparatus 100 will be described.

As shown in FIG. 2, a coating and developing apparatus 21 and a wafer FOUP transfer apparatus 22 are provided outside the exposure apparatus 100.

The coating and developing apparatus 21 coats resist on an unexposed wafer and performs a developing process of the exposed wafer.

The wafer FOUP transfer apparatus 22 connects the exposure apparatus 100 (the exposure apparatus chamber 20) and the coating and developing apparatus 21. The wafer is conveyed between the exposure apparatus 100 and the coating and developing apparatus 21 using a wafer FOUP (Front Open Unified Pod) (not shown) that is a carrier of the wafer. The wafer FOUP transfer apparatus 22 delivers the wafer FOUP in which the wafer is stored for the exposure apparatus 100 and for the coating and developing apparatus 21 that is an external apparatus.

Next, as a comparative example, in a conventional exposure apparatus, a delivery mechanism for delivering a wafer mounted on a wafer chuck to a wafer conveying robot hand will be described.

FIG. 3 is a side view showing a delivery mechanism which delivers an exposed wafer mounted on the wafer chuck to a conventional wafer conveying robot hand. FIGS. 3A to 3E are schematic views where the motions of the delivery mechanism are arranged in time series.

Figure 3A:
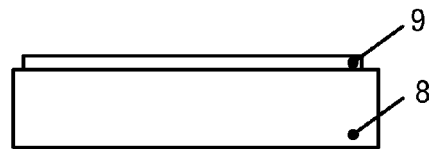
FIGS. 3A to 3E are side views showing a motion of a conventional wafer conveying robot hand.

FIG. 3A shows a state where the exposed wafer 9 is mounted on the wafer chuck 8. In a state of FIG. 3A, the absorption for holding the wafer 9 is released.

Figure 3B:
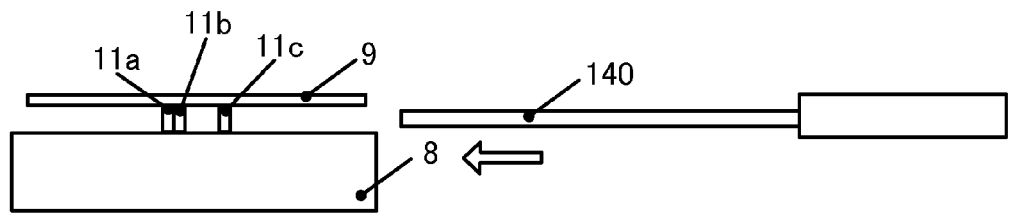

FIG. 3B shows a state where the elevation device (three pins) has risen. When the three pins 11a, 11b, and 11c move in an upward direction, the wafer 9 mounted on the wafer chuck 8 moves in the upward direction in a state where the wafer 9 is held by end portions of these pins. In other words, the three pins 11a, 11b, and 11c raise the wafer 9 mounted on the wafer chuck 8.

Figure 3C:
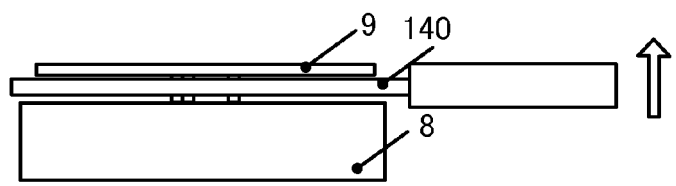

FIG. 3C shows a state where the wafer conveying robot hand 140 is inserted between the wafer chuck 8 and the wafer 9. When the three pins 11a, 11b, and 11c rise up to a predetermined position in FIG. 3B, a gap between the wafer chuck 8 and the wafer 9 whose thickness is wider than that of the wafer conveying robot hand 140 is formed. Therefore, the wafer conveying robot hand 140 can be inserted into a space between the wafer chuck 8 and the wafer 9 without contacting between the wafer chuck 8 and the wafer 9 as shown in FIG. 3C.

Figure 3D:
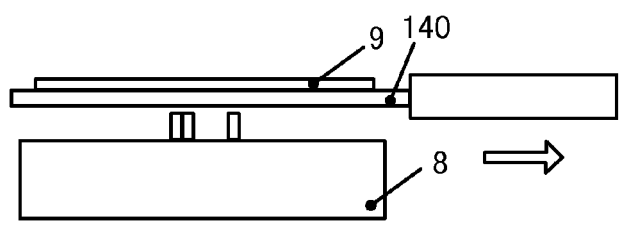

FIG. 3D shows a state where the wafer conveying robot hand 140 has moved in an upward direction. In FIG. 3D, when the wafer conveying robot hand 140 has moved in the upward direction up to a predetermined position, it contacts the wafer 9. Then, the wafer conveying robot hand 140 holds the wafer 9 apart from the three pins 11a, 11b, and 11c. When the wafer conveying robot hand 140 further moves in an upward direction to reach the predetermined position, as shown in a side view of FIG. 3D, it reaches a position higher than that of the end portions of the three pins 11a, 11b, and 11c.

Figure 3E:
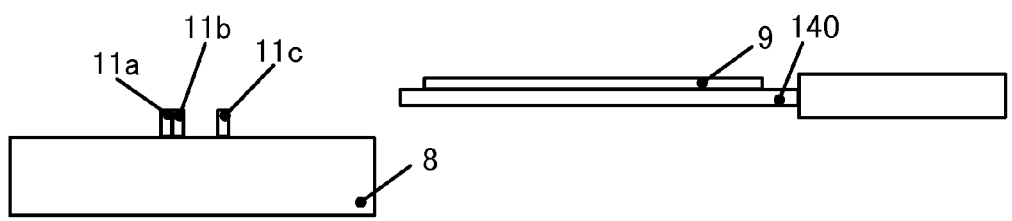

FIG. 3E shows a state where the wafer conveying robot hand 140 has picked up the wafer 9. In a state of FIG. 3D, when the wafer conveying robot hand 140 moves in a right direction of the drawings, as shown in FIG. 3E, it can pick the wafer 9 up without contacting the three pins 11a, 11b, and 11c.

FIG. 4 is a plan view showing a mechanism delivering an exposed wafer mounted on the wafer chuck to a conventional wafer conveying robot hand. FIGS. 4A to 4E are schematic views where the motions of the delivery mechanism are arranged in time series. In each of FIGS. 4A to 4E, one example of a moving trajectory of the XY stage 6 is shown by a triangle indicated by a dashed-dotted line.

Figure 4A:
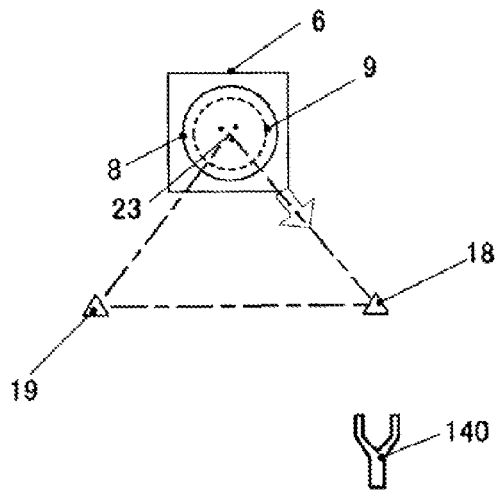
FIGS. 4A to 4E are plan views showing a motion of a conventional wafer conveying robot hand.

FIG. 4A shows a state where the absorption to hold the exposed wafer 9 mounted on the wafer chuck 8 has been released. While the wafer 9 is delivered to the elevating device (three pins), the XY stage 6 starts to move to the wafer transfer position 18.

Figure 4D:
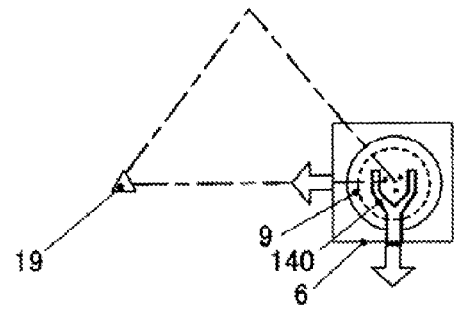
Figure 4B:
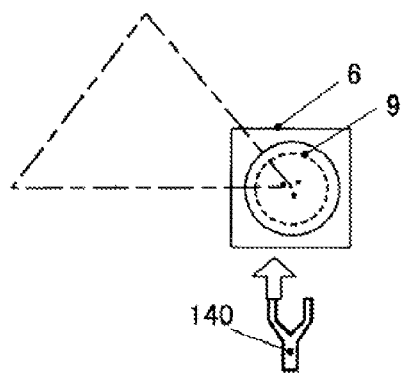

FIG. 4B shows a state where the delivery of the wafer 9 from the wafer chuck 8 to the three pins has been completed and the XY stage 6 has reached the wafer transfer position 18. In this state, the wafer conveying robot hand 140 moves to the wafer transfer position 18 and is inserted into a space between the wafer chuck 8 and the wafer 9.

Figure 4E:
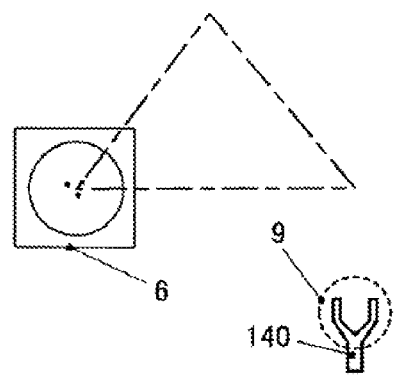
Figure 4C:
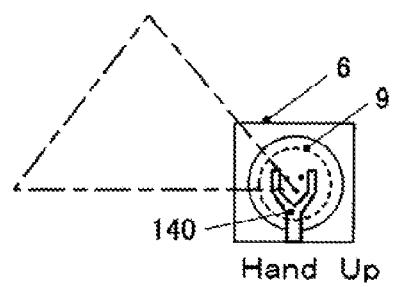

FIG. 4C shows a state where the wafer conveying robot hand 140 has moved in an upward direction. In FIG. 4C, the wafer conveying robot hand 140 obtains and holds the wafer 9.

FIG. 4D shows a state where the wafer conveying robot hand 140 starts to pick up the received wafer 9. When the wafer conveying robot hand 140 starts to pick up the wafer 9, at the same time, the XY stage 6 starts to move to the wafer supply position 19 placed at the left side.

FIG. 4E shows a state where the wafer conveying robot hand 140 has completed picking up the wafer 9. In this case, the XY stage 6 has reached the wafer supply position 19. At the wafer supply position 19, the wafer dispatching hand 12 shown in FIG. 2 holds a new wafer 9 and prepares to deliver the wafer 9 to the three pins (not shown).

Next, in the exposure apparatus of the present embodiment, a delivery mechanism for delivering the wafer mounted on the wafer chuck to the wafer conveying robot hand will be described.

FIG. 5 is a plan view showing a delivery mechanism which delivers an exposed wafer mounted on the wafer chuck to a wafer conveying robot hand 14 of the present embodiment. FIGS. 5A to 5E are schematic views where the motions of the delivery mechanism are arranged in time series. Each of FIGS. 5A to 5E shows one example of a moving trajectory of the XY stage 6 by a triangle indicated by a dashed-dotted line.

Figure 5A:
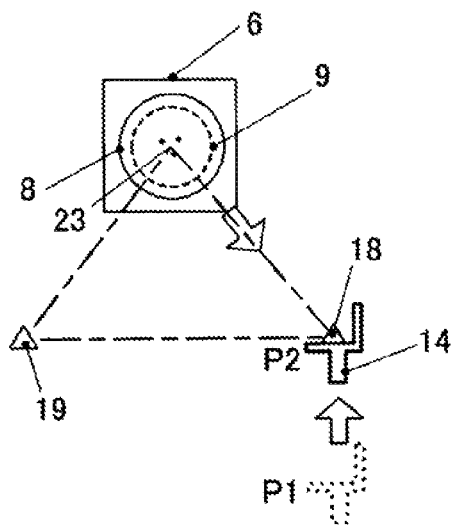
FIGS. 5A to 5E are plan views showing a motion of a wafer conveying robot hand of the present embodiment.

FIG. 5A shows a state where the absorption to hold an exposed wafer 9 mounted on the wafer chuck 8 has been released. While the wafer 9 is delivered to the elevating device (three pins), the XY stage 6 starts to move to the wafer transfer position 18.

Here, the wafer conveying robot hand 14 of the present embodiment starts to move to the wafer transfer position 18 based on information that the wafer delivery process from the wafer chuck 8 to the three pins is completed. In a state of FIG. 5A, the wafer conveying robot hand 14 has already completed moving to the wafer transfer position 18 and stands by at the wafer transfer position 18.

Even in a case where the wafer conveying robot hand 14 of the present embodiment stands by, the three pins do not contact and clash the wafer conveying robot hand 14 in a case where the XY stage 6 moves to the wafer transfer position 18 by a minimum distance.

On the other hand, as shown in FIGS. 4A to 4E, a conventional wafer conveying robot hand 140 has a holder at the left side of the hand. Therefore, when the wafer conveying robot hand 140 has previously completed moving to the wafer transfer position 18 to stand by at this position, the three pins clash the wafer conveying robot hand 140 if the XY stage 6 moves to the wafer transfer position 18 by a minimum distance.

The wafer conveying robot hand 14 of the present embodiment does not have a holder at a passing point of the three pins when the XY stage 6 moves to the wafer transfer position 18 by a minimum distance. Furthermore, in the present embodiment, the delivery of the wafer 9 from the wafer chuck 8 to the three pins is completed earlier than the moving time of the XY stage 6 to the wafer transfer position 18.

Therefore, according to the wafer conveying robot hand 14 of the present embodiment, time that is necessary for the wafer conveying robot hand 14 to receive the wafer 9 can be shortened to improve throughput.

Figure 5D:
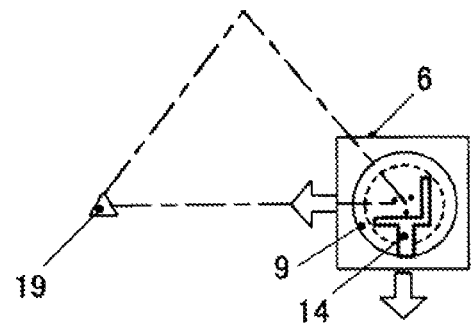
Figure 5B:
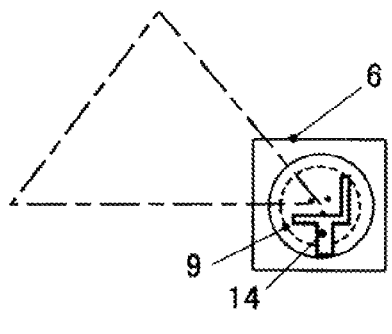

FIG. 5B shows a state where the delivery of the wafer 9 from the wafer chuck 8 to the three pins has been completed and the XY stage 6 has reached the wafer transfer position 18. In this state, the wafer conveying robot hand 14 of the present embodiment has already reached the wafer transfer position 18.

Furthermore, the three pins has completed rising, and the wafer 9 has already formed a predetermined space for the wafer chuck 8, i.e. a space whose thickness is wider than that of the wafer conveying robot hand 14. Therefore, at the phase where the XY stage 6 has reached the wafer transfer position 18, the wafer conveying robot hand 14 has been already inserted into the space between the wafer chuck 8 and the wafer 9.

Figure 5E:
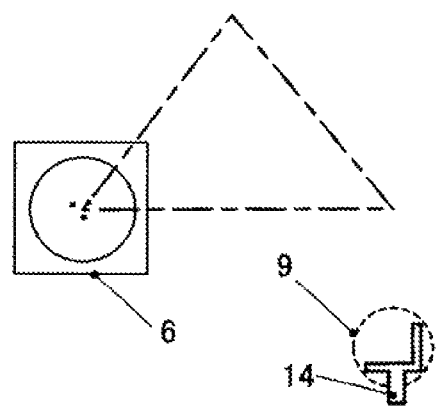
Figure 5C:
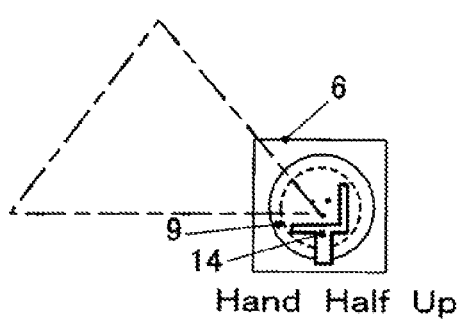

FIG. 5C shows a state where the wafer conveying robot hand 14 of the present embodiment has moved in an upward direction. In FIG. 5C, the wafer conveying robot hand 14 receives the wafer 9 to hold it. In the present embodiment, the moving distance of the wafer conveying robot hand 14 in an upward direction is smaller than that of the conventional wafer conveying robot hand 140 shown in FIG. 4C. The reason will be described later using FIGS. 6A and 6B.

FIG. 5D shows a state where the wafer conveying robot hand 14 of the present embodiment starts to pick up the received wafer 9. When the wafer conveying robot hand 14 starts to pick up the wafer 9 (a downward direction in FIG. 5D), at the same time, the XY stage 6 starts to move to the wafer supply position 19 placed at the left side.

FIG. 5E shows a state where the wafer conveying robot hand 14 of the present embodiment has completed picking up the wafer 9. At this time, the XY stage 6 has reached the wafer supply position 19. At the wafer supply position 19, the wafer dispatching hand 12 shown in FIG. 2 holds a new wafer 9 and prepares to deliver the wafer 9 to the three pins (not shown).

Next, the improvement of the throughput when using the wafer conveying robot hand 14 of the present embodiment will be described compared with the case where the conventional wafer conveying robot hand 140 is used.

Figure 6A:
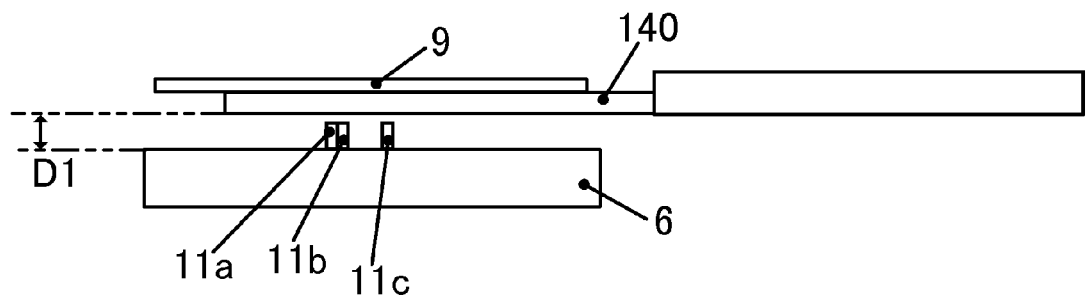
FIGS. 6A and 6B are side views showing a relationship between an XY stage and a wafer conveying robot hand at a wafer supply position, which compare a conventional art (FIG. 6A) and the present embodiment (FIG. 6B).
Figure 7A:
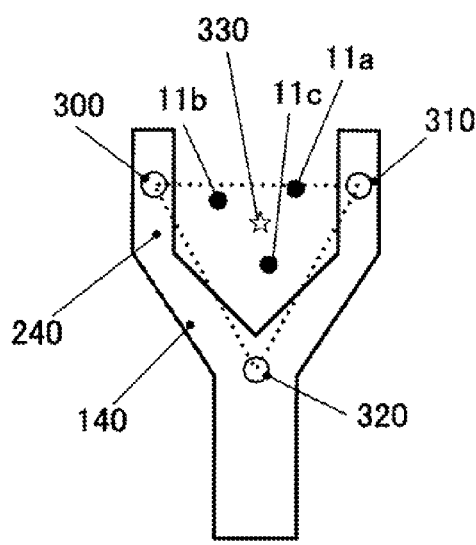
FIGS. 7A and 7B are plan views showing a relationship between an absorption pad of a wafer conveying robot hand and a position of center of gravity of a wafer.

FIG. 6A shows a situation at the time that the conventional wafer conveying robot hand 140 has moved in an upward direction to receive the wafer 9 and the XY stage 6 starts to move to the wafer supply position 19. FIG. 6A is a schematic view (a side view) seen from the wafer supply position 19 to the wafer transfer position 18. FIG. 7A is a schematic view (a plan view), which is seen from the above, of the same state as that of FIG. 6A.

Figure 6B:
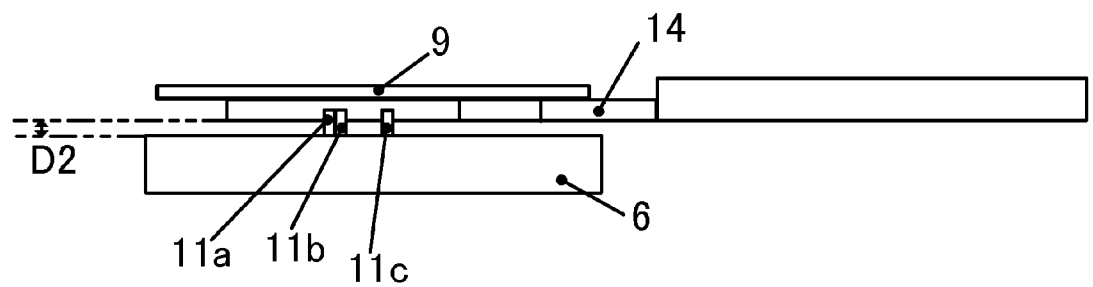
Figure 7B:
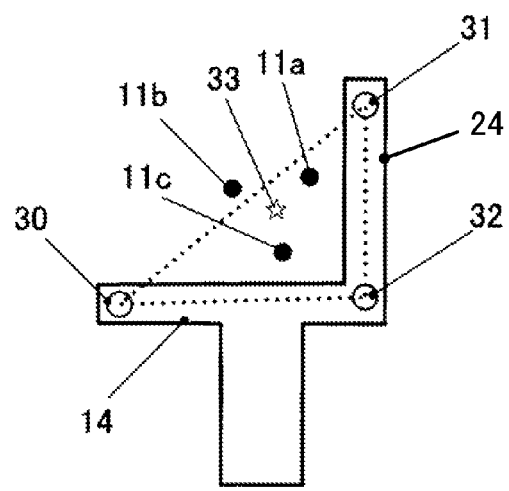

FIG. 6B shows a situation at the time that the wafer conveying robot hand 14 of the present embodiment has moved in an upward direction to receive the wafer 9 and the XY stage 6 starts to move to the wafer supply position 19. FIG. 6B is a schematic view (a side view) seen from the wafer supply position 19 to the wafer transfer position 18. FIG. 7B is a schematic view (a plan view), which is seen from above, of the same state as that of FIG. 6B.

In FIG. 7A, reference numerals 300, 310, and 320 denote absorption pads which are provided on the conventional wafer conveying robot hand 140 for absorbing the wafer 9. Reference numeral 330 denotes a position of center of gravity of the wafer 9 placed on the three pins 11a, 11b, and 11c.

In FIG. 7B, reference numerals 30, 31, and 32 denote absorption pads which are provided on the wafer conveying robot hand 14 of the present embodiment for absorbing the wafer 9. Reference numeral 33 denotes a position of center of gravity of the wafer 9 placed on the three pins 11a, 11b, and 11c.

The XY stage 6 in each of FIGS. 6A and 6B moves in a left side direction of FIGS. 6A and 6B after corresponding one of the wafer conveying robot hands 14 and 140 receives the wafer 9.

The conventional wafer conveying robot hand 140 shown in FIG. 7A has a holder 240 at the left side as well as the right side of the hand. In other words, the holder 240 has a U-shaped portion whose upper side is open. Therefore, when the wafer conveying robot hand 140 has not adequately moved to an upward direction, it may clash the three pins 11a, 11b, and 11c.

Therefore, as shown in FIG. 6A, the XY stage 6 starts to move to the wafer supply position 19 after the hand has been completely away from the above of the three pins 11a, 11b, and 11c. In other words, the XY stage 6 starts to move after the distance D1 between the wafer conveying robot hand 140 and the XY stage 6 (the wafer chuck 8) has been greater than the height of the three pins 11a, 11b, and 11c.

On the other hand, as shown in FIG. 7B, the wafer conveying robot hand 14 of the present embodiment does not have a holder 24 at the left side of the hand. In other words, the holder 24 has an L-shaped portion whose upper side and left side are open. Therefore, the wafer conveying robot hand 14 of the present embodiment does not have a portion that is an obstacle in a moving direction of the XY stage 6. In other words, the XY stage 6 can move to the wafer supply position 19 without clashing a part of the wafer conveying robot hand 14.

Therefore, the XY stage 6 can start to move to the wafer supply position 19 at the time that the wafer 9 is removed from the three pins 11a, 11b, and 11c. In other words, even if the distance D2 between the wafer conveying robot hand 14 and the XY stage 6 (the wafer chuck 8) is smaller than the height of the three pins 11a, 11b, and 11c, the XY stage 6 can start to move.

As described above, in the conventional art, the XY stage 6 can not start to move before the conventional wafer conveying robot hand 140 has risen by the distance D1. On the other hand, in the present embodiment, the XY stage 6 can start to move when the wafer conveying robot hand 14 has risen by the distance D2 smaller than the distance D1. Therefore, due to the difference of the moving distance, the wafer conveying robot hand 14 of the present embodiment can shorten time required for the movement to improve throughput.

As shown in FIG. 7B, in the present embodiment, the wafer conveying robot hand 14 has three absorption pads that are parts attracting the wafer 9. In this case, the wafer 9 is preferably held so that the position of center of gravity 33 of the wafer is positioned inside a triangle whose corners are the absorption pads 30, 31, and 32 of the wafer conveying robot hand 14.

As shown in FIG. 7A, this is also true for the relation between absorption pads 300, 310, and 320 of the conventional wafer conveying robot hand 140 and the position of center of gravity 330 of the wafer. However, the wafer conveying robot hand 14 of the present embodiment has a holder whose angle is larger than that of the conventional one. Therefore, it is particularly important for the wafer conveying robot hand 14 of the present embodiment to configure the relation between the absorption pads 30, 31, and 32 and the position of center of gravity 33 of the wafer.

According to the present embodiment, the risk of dropping the wafer can be minimized by the above configuration even in a situation where the adequate absorption power is unable to be maintained due to the trouble of the apparatus or the factory at the time of delivering or conveying the wafer.

Figure 8:
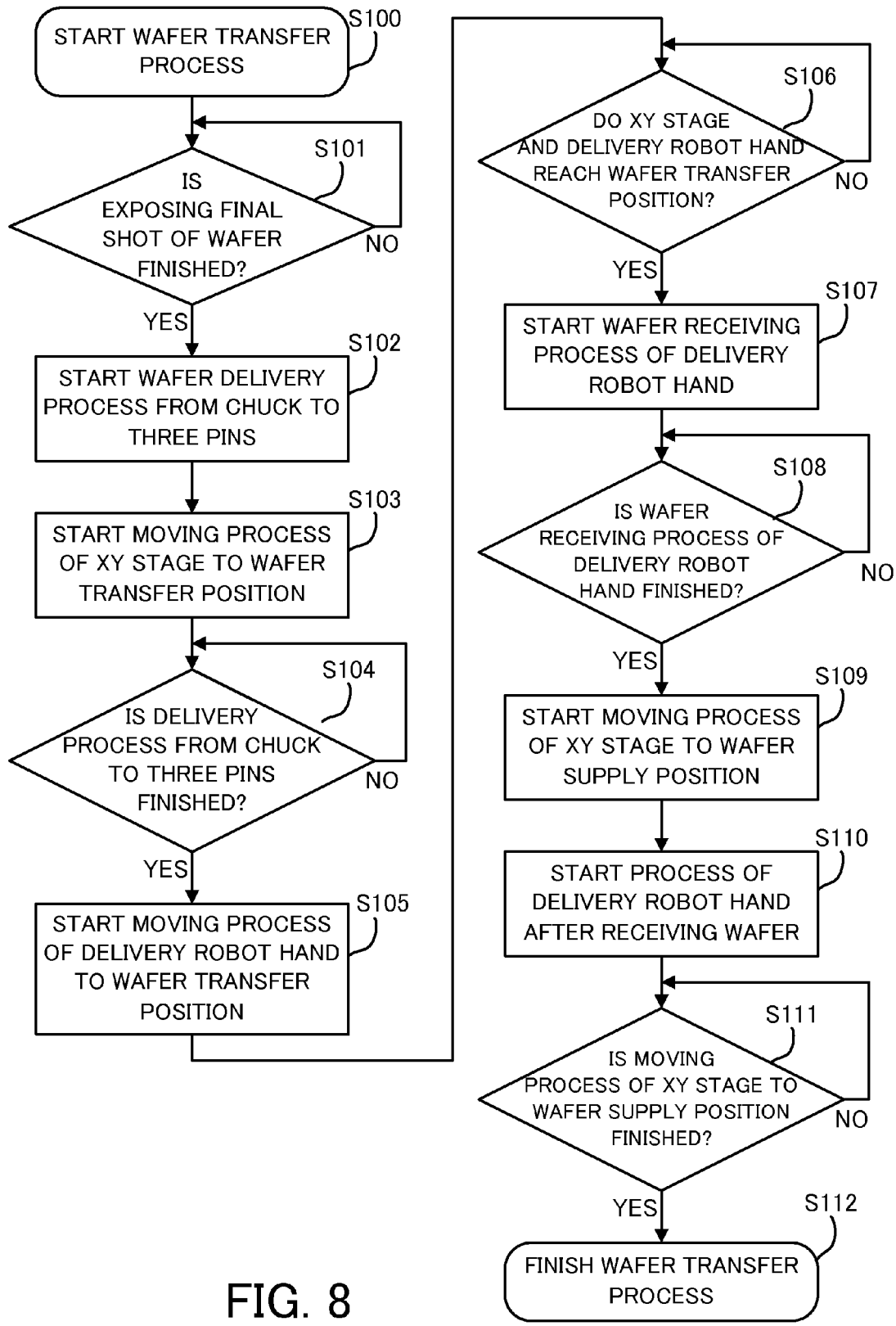
FIG. 8 is a flowchart showing a control method in the present embodiment.

Next, a wafer conveying processing procedure in the exposure apparatus of the present embodiment will be described. FIG. 8 is a flowchart showing a wafer conveying processing procedure using the wafer conveying robot hand 14 of the present embodiment.

First, in Step S100, the control computer 15 starts a wafer transfer process. In Step S101, the control computer 15 determines whether or not an exposure process of a final shot of a wafer to be processed has been finished. If the control computer 15 determines that the exposure process has not been finished yet, it performs the process of Step S101 again, and on the other hand, if it determines that the exposure process has been finished, it performs the process of Step S102.

In Step S102, the wafer delivering process from the wafer chuck 8 to the three pins is started. In Step S103, the XY stage 6 starts a moving process to the wafer transfer position 18.

Subsequently, in Step S104, the control computer 15 determines whether or not the wafer delivering process from the wafer chuck 8 to the three pins has been finished. If the wafer delivering process has not been finished, the control computer 15 performs the process of Step S104 again. On the other hand, if the wafer delivering process has been finished, the control computer 15 performs a process of Step S105. Thus, the control computer 15 controls the motions of the XY stage and the wafer conveying robot hand so that the wafer conveying robot hand 14 is positioned at the wafer transfer position 18 in synchronization with the rise of the three pins relative to the wafer chuck.

In Step S105, the wafer conveying robot hand 14 moves to the wafer transfer position 18. In the present embodiment, the wafer conveying robot hand 14 reaches the wafer transfer position 18 before the XY stage 6 reaches the wafer transfer position 18. In other words, the control computer 15 controls the motions of the XY stage 6 and the wafer conveying robot hand 14 so that the wafer conveying robot hand 14 is positioned at the wafer transfer position 18 before the XY stage 6 is positioned at the wafer transfer position 18.

In Step S106, the control computer 15 determines whether or not the XY stage 6 has reached the wafer transfer position 18. If the XY stage 6 has not reached the wafer transfer position 18, the control computer 15 performs the process of Step S106 again, and on the other hand, if the XY stage 6 has reached the wafer transfer position 18, the control computer 15 performs a process of Step S107.

In Step S107, the wafer conveying robot hand 14 moves upward to start a receiving process for receiving the wafer 9. In Step S108, the control computer 15 determines whether or not the wafer conveying robot hand 14 has finished the receiving process of the wafer 9, and if the receiving process of the wafer 9 has not been finished, it performs the process of Step S108 again.

On the other hand, if the receiving process of the wafer 9 has been finished, the control computer 15 performs a process of Step S109. In Step S109, the XY stage 6 starts to move to the wafer supply position 19. In other words, the control computer 15 performs a control so that the wafer conveying robot hand 14 rises relative to the XY stage 6 at the wafer transfer position 18 to deliver the wafer 9 from the XY stage 6 to the wafer conveying robot hand 14. Furthermore, it controls the motions of the XY stage 6 and the wafer conveying robot hand 14 so that the XY stage 6 moves from the wafer transfer position 18 in synchronization with the delivery.

Next, in Step S110, the wafer conveying robot hand 14 starts a process that is to be performed after receiving the wafer 9.

In Step S111, the control computer 15 determines whether or not the XY stage 6 has finished moving to the wafer supply position 19. If the control computer 15 determines that it has not finished moving to the wafer supply position 19, it performs the process of Step S111 again. On the other hand, if the control computer 15 determines that XY stage 6 has finished moving to the wafer supply position 19, it performs a process of Step S112.

In Step S112, the control computer 15 finishes the wafer transfer process.

When the wafer delivering control using the wafer conveying robot hand 14 of the present embodiment is performed by a method of the wafer conveying process described above, the throughput can be improved.

Conventionally, when the moving process of the XY stage 6 in an X direction to the wafer transfer position 18 has not been finished, the wafer conveying robot hand 140 can not move to the wafer transfer position 18. However, in the present embodiment, at the time that the wafer delivering process from the wafer chuck 8 to the three pins has been finished, the wafer conveying robot hand 14 can move to the wafer transfer position 18.

Thus, according to the exposure apparatus of the present embodiment, compared to the conventional apparatus, the improvement of throughput can be realized.

Figure 9:
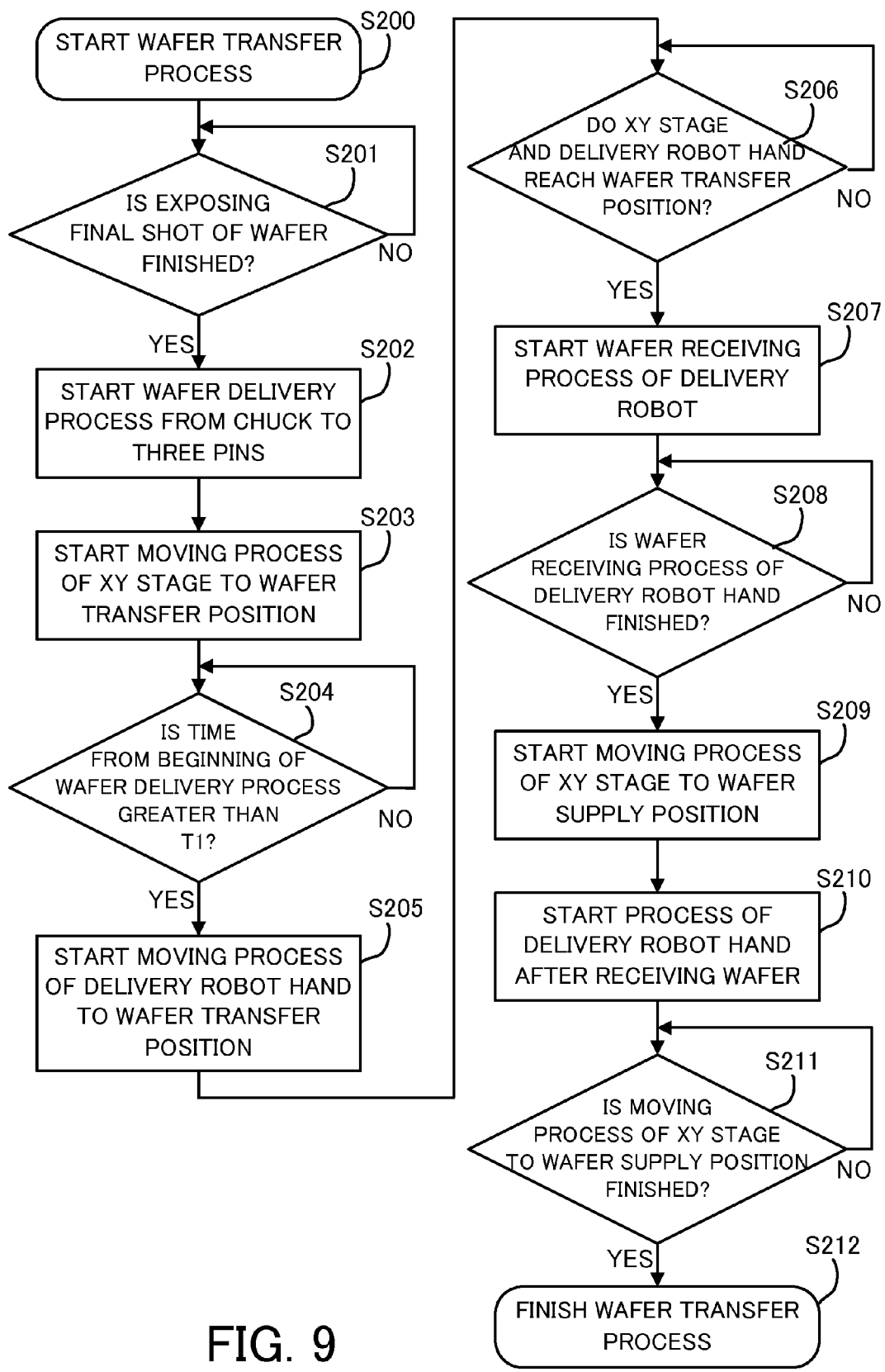
FIG. 9 is a flowchart showing a control method for further improving throughput in the present embodiment.

Next, another procedure for the wafer conveying process in an exposure apparatus of the present embodiment will be described. FIG. 9 is a flowchart showing another procedure for the wafer conveying process using the wafer conveying robot hand 14 of the present embodiment. The procedure for the wafer conveying process shown in FIG. 9 is a procedure for moving the wafer conveying robot hand 14 to the wafer transfer position 18 at an earlier timing, compared to the procedure of FIG. 8.

Since Steps S200 to S203 are the same as Step S100 to S103 of FIG. 8, respectively, the description thereof will be omitted.

Subsequently, in Step S204, the control computer 15 determines whether or not the passing time from the beginning of the wafer delivering process (Step S202) from the wafer chuck 8 to the three pins is greater than a predetermined time T1. If the control computer 15 determines that the passing time does not greater than time T1, it performs the process of Step S204 again. On the other hand, if the control computer 15 determines that the passing time is greater than time T1, it performs a process of Step S205.

Here, a method for determining time T1 will be described.

If the wafer delivering process from the wafer chuck 8 to the three pins has been completed, the wafer conveying robot hand 14 of the present embodiment does not clash the wafer 9. However, if the wafer delivering process has not been completed, the wafer conveying robot hand 14 may possibly clash the wafer 9. Furthermore, in a system where the wafer delivering process from the wafer chuck 8 to the three pins is performed by bringing the wafer chuck 8 down, the wafer conveying robot hand 14 may possibly clash the wafer chuck 8.

In the embodiment, time required for the wafer conveying robot hand 14 to move from position P1 of FIG. 5a to position P2 (wafer transfer position 18) is defined as TIME1. Also, time required for the wafer delivering process from the wafer chuck 8 to the three pins is defined as TIME2. Further, time required for the XY stage 6 to move to the wafer transfer position 18 is defined as TIME3.

In this case, when T1=TIME2−TIME1 is satisfied, the wafer delivering process from the wafer chuck 8 to the three pins is finished at the time that the wafer conveying robot hand 14 completes the movement to the wafer transfer position 18.

In the present embodiment, commonly, the following relation is satisfied among TIME1, TIME2, and TIME3.

TIME1<TIME2<TIME3

Since Steps S205 to S212 are the same as Steps S105 to S112 of FIG. 8, respectively, the description thereof will be omitted.

When the wafer delivering control using the wafer conveying robot hand 14 of the present embodiment is performed by the procedure of the wafer conveying process described above, the risk of the clash is avoided and the process time can be further shortened. Therefore, the further improvement of throughput can be realized.

The processing procedure shown in FIG. 9 is a method for previously determining time T1 to perform a control. However, if the moving time of each of the wafer conveying robot hand 14 and the XY stage 6 is not always constant, time T1 may not be able to be predetermined.

In such a case, a method for calculating time T1 based on position information and moving velocity information of the wafer conveying robot hand 14 and the XY stage 6 to determine a moving timing of the wafer conveying robot hand 14 to the wafer transfer position 18. Even in such a method, the improvement of throughput can be realized.

When determining the moving timing, the moving time is preferably determined so that there is no risk of the clash even if the control abnormality of one or both of the wafer conveying robot hand 14 and the XY stage 6 is generated. Such a control can improve the throughput and heighten the security.

In a first control method in the exposure apparatus of the present embodiment, the delivery robot hand goes into the delivery position at the timing of finishing the wafer delivery from the wafer chuck to the delivery mechanism (elevating device) after the exposure process at the final shot exposure position of the wafer has been finished. XY stage moves from the final shot exposure position (substrate exposure position, substrate process position) to the wafer delivery position (substrate transfer position) in the shortest time. This control method can deliver the wafer in a shorter time.

In a second control method in the exposure apparatus of the present embodiment, when the XY stage goes into the delivery position (substrate transfer position), parts or all of time information, drive velocity, acceleration information, and position information which are necessary to drive the XY stage and the delivery robot hand are used. The control computer performs a control so that the delivery robot hand goes into the delivery position at the timing that the wafer chuck does not interfere with the delivery robot hand. According to the control method, the delivery robot hand can receive the wafer positioned on the elevating device in safety and in a short time.

In a third control method in the exposure apparatus of the present embodiment, the XY stage and the delivery robot hand reach the delivery position and the delivery robot hand receives the wafer. Subsequently, the XY stage (elevating device) starts the evacuation movement at the timing that the wafer has moved away to the position where the wafer does not interfere with the XY stage. The control method enables the delivery robot hand to receive the wafer on the XY stage in safety and in a short time.

A device (a semiconductor device, a liquid crystal display device, or the like) is manufactured by performing a process of exposing a substrate (a wafer, a glass plate, or the like) which is coated by a photosensitizing agent using a exposure apparatus in any one of the above embodiments, a process of developing the substrate, and other well-known processes.

According to the present embodiment, an exposure apparatus (a processing apparatus) which improves throughput can be provided. Further, according to the present embodiment, a device manufacturing method using such an exposure apparatus can be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-197125, filed on Jul. 31, 2008, which is hereby incorporated by reference herein in its entirety.

What is claimed is:

1. A processing apparatus configured to process a substrate, the processing apparatus comprising:
a movable stage which includes a chuck configured to hold the substrate and an elevating device configured to rise relative to the chuck to hold the substrate; and
a movable hand configured to convey the substrate from the movable stage at a transfer position,
wherein the movable stage moves to change from a first direction to a second direction at an angle between 30 degrees and 120 degrees via the transfer position in a state where the elevating device rises relative to the chuck, and
wherein the movable hand has a shape such that:
a) in a case where a delivery of the substrate from the chuck to the elevating device is completed before the movable stage reaches the transfer position, the movable stage and the substrate held by the elevating device, which reach the transfer position from the first direction, do not interfere with the movable hand positioned at the transfer position before the movable stage reaches the transfer position, and
b) in a state, at the transfer position, where a delivery of the substrate from the elevating device to the movable hand is completed, and a height of a lower surface of the movable hand relative to the chuck is smaller than a height of an upper surface of the elevating device relative to the chuck, the movable stage, which starts moving to the second direction, does not interfere with the movable hand and the substrate held by the movable hand.

2. A processing apparatus according to claim 1, wherein the movable hand has three portions which attract the substrate and is configured to hold the substrate so that a center of gravity of the substrate is positioned inside a triangle whose corners correspond to the three portions.

3. A processing apparatus according to claim 1, wherein the elevating device has three pins and is configured to hold the substrate by the three pins.

4. A processing apparatus according to claim 1, further comprising a controller configured to control operations of the movable stage and the movable hand so that the movable hand is positioned at the transfer position before the movable stage is positioned at the transfer position.

5. A processing apparatus according to claim 4, wherein the controller is configured to control the operations of the movable stage and the movable hand so that, in a case where the delivery of the substrate from the chuck to the elevating device is not completed before the movable stage reaches the transfer position, the movable hand is positioned at the transfer position in synchronization with completion of the delivery rise of the elevating device.

6. A processing apparatus according to claim 4, wherein the controller is configured to control the operations of the movable stage and the movable hand so that the substrate is delivered from the movable stage to the movable hand by raising the movable hand relative to the movable stage at the transfer position and the movable stage moves to the second direction from the transfer position in synchronization with the delivery.

7. A processing apparatus configured to process a substrate, the processing apparatus comprising:
a movable stage which includes a chuck configured to hold the substrate and an elevating device configured to rise relative to the chuck to hold the substrate and is configured to move between a substrate process position, a substrate transfer position, and a substrate supply position;
a first movable hand configured to convey the substrate held by the elevating device risen relative to the chuck at the substrate transfer position; and
a second movable hand configured to supply the substrate to the movable stage at the substrate supply position,
wherein an angle between a first straight line which connects the substrate transfer position with the substrate process position and a second straight line which connects the substrate transfer position and the substrate supply position is between 30 degrees and 120 degrees, and
wherein the first movable hand has a shape such that:
a) in a case where a delivery of the substrate from the chuck to the elevating device is completed before the movable stage reaches the substrate transfer position, the movable stage and the substrate held by the elevating device, which reach the substrate transfer position from a direction of the first straight line, do not interfere with the first movable hand positioned at the substrate transfer position before the movable stage reaches the substrate transfer position, and
b) in a state, at the substrate transfer position, where a delivery of the substrate from the elevating device to the first movable hand is completed, and a height of a lower surface of the first movable hand relative to the chuck is smaller than a height of an upper surface of the elevating device relative to the chuck, the movable stage, which starts moving to a direction of the second straight line, does not interfere with the first movable hand and the substrate held by the first movable hand.

8. A processing apparatus according to claim 1, wherein the process includes a transfer of a pattern onto the substrate.

9. A method of manufacturing a device, the method comprising:
processing a substrate using a processing apparatus to manufacture the device,
wherein the processing apparatus is configured to process the substrate, the apparatus comprises:
a movable stage which includes a chuck configured to hold the substrate and an elevating device configured to rise relative to the chuck to hold the substrate; and
a movable hand configured to convey the substrate from the movable stage at a transfer position,
wherein the movable stage moves to change a direction from a first direction to a second direction at an angle between 30 degree and 120 degree via the transfer position in a state where the elevating device rises relative to the chuck, and
the movable hand has a shape such that:
a) in a case where a delivery of the substrate from the chuck to the elevating device is completed before the movable stage reaches the transfer position, the movable stage and the substrate held by the elevating device, which reach the transfer position from the first direction, do not interfere with the movable hand positioned at the transfer position before the movable stage reaches the transfer position, and
b) in a state, at the transfer position, where a delivery of the substrate from the elevating device to the movable hand is completed, and a height of a lower surface of the movable hand relative to the chuck is smaller than a height of an upper surface of the elevating device relative to the chuck, the movable stage, which starts moving to the second direction, does not interfere with the movable hand and the substrate held by the movable hand.

10. A method of manufacturing a device, the method comprising:
processing a substrate using a processing apparatus to manufacture the device,
wherein the processing apparatus is configured to process the substrate, the apparatus comprises:
a movable stage which includes a chuck configured to hold the substrate and an elevating device configured to rise relative to the chuck to hold the substrate and is configured to move between a substrate process position, a substrate transfer position, and a substrate supply position;
a first movable hand configured to convey the substrate held by the elevating device risen relative to the chuck at the substrate transfer position; and
a second movable hand configured to supply the substrate to the movable stage at the substrate supply position,
wherein an angle between a first straight line which connects the substrate transfer position with the substrate process position and a second straight line which connects the substrate transfer position and the substrate supply position is between 30 degrees and 120 degrees, and
wherein the first movable hand has a shape such that:
a) in a case where a delivery of the substrate from the chuck to the elevating device is completed before the movable stage reaches the substrate transfer position, the movable stage and the substrate held by the elevating device, which reach the substrate transfer position from a direction of the first straight line, do not interfere with the first movable hand positioned at the substrate transfer position before the movable stage reaches the substrate transfer position, and b) in a state, at the substrate transfer position, where a delivery of the substrate from the elevating device to the first movable hand is completed, and a height of a lower surface of the first movable hand relative to the chuck is smaller than a height of an upper surface of the elevating device relative to the chuck, the movable stage, which starts moving to a direction of the second straight line, does not interfere with the first movable hand and the substrate held by the first movable hand.

* * * * *